United States Patent
Akita et al.

(10) Patent No.: US 7,275,696 B2
(45) Date of Patent: Oct. 2, 2007

(54) NON-CONTACT ID CARD AND THE LIKE AND METHOD FOR MANUFACTURING SAME

(75) Inventors: Masanori Akita, Otsu (JP); Yoshiki Sawaki, Otsu (JP)

(73) Assignee: Toray Engineering Company, Limited, Osaka (JP)

( * ) Notice: Subject to any disclaimer, the term of this patent is extended or adjusted under 35 U.S.C. 154(b) by 146 days.

(21) Appl. No.: 10/532,087

(22) PCT Filed: Oct. 23, 2003

(86) PCT No.: PCT/JP03/13510

§ 371 (c)(1),
(2), (4) Date: Apr. 21, 2005

(87) PCT Pub. No.: WO2004/038793

PCT Pub. Date: May 6, 2004

(65) Prior Publication Data

US 2006/0054707 A1     Mar. 16, 2006

(30) Foreign Application Priority Data

Oct. 24, 2002  (JP)  ............................ 2002-309455

(51) Int. Cl.
*G06K 19/06* (2006.01)

(52) U.S. Cl. .................. 235/492; 235/441; 235/487

(58) Field of Classification Search ............ 235/492, 235/488, 451; 361/771, 737, 809; 317/820; 256/679

See application file for complete search history.

(56) References Cited

U.S. PATENT DOCUMENTS

| 6,380,614 B1 * | 4/2002 | Higuchi et al. ............. 257/679 |
| 6,459,588 B1 * | 10/2002 | Morizumi et al. .......... 361/737 |
| 6,554,194 B1 * | 4/2003 | Sasaki et al. ............... 235/492 |
| 6,779,733 B2 * | 8/2004 | Akita et al. ................. 235/492 |

FOREIGN PATENT DOCUMENTS

| JP | 1-140579 A | 6/1989 |
| JP | 4-272607 A | 9/1992 |
| JP | 9-246271 A | 9/1997 |
| JP | 2000-294599 A | 10/2000 |
| JP | 2001-230529 A | 8/2001 |
| WO | 01/62517 A1 | 8/2001 |

* cited by examiner

*Primary Examiner*—Seung Ho Lee
(74) *Attorney, Agent, or Firm*—Kubovcik & Kubovcik

(57) ABSTRACT

A low-cost non-contact ID card having practical electrical properties and the like is disclosed. The non-contact ID card comprises an antenna circuit board wherein an antenna is formed on a substrate and an interposer board wherein an enlarged electrode is formed on a substrate that is mounted with an IC chip. The enlarged electrode is connected to an electrode of the IC chip. The antenna circuit board and the interposer board are joined in such a manner that an electrode of the antenna is in direct contact with the enlarged electrode which is a resin electrode made of a conductive resin containing a thermoplastic resin.

7 Claims, 4 Drawing Sheets

NON-CONTACT ID CARD AND THE LIKE AND METHOD FOR MANUFACTURING SAME

This application is a 371 of international application PCT/JP2003/013510 filed Oct. 23, 2003, which claims priority based on Japanese patent application No. 2002-309455 filed Oct. 24, 2002.

BACKGROUND OF THE INVENTION

1. Field of the Invention

The present invention relates to a non-contact ID card and the like and a method of manufacturing thereof.

2. Detailed Description of the Prior Art

In the prior art, a number of antenna circuit board formats on which IC chips are mounted—in other words, non-contact ID cards and non-contact tags, etc. (hereinafter referred to as "non-contact ID cards and the like") have been known.

Examples of the known non-contact ID cards and the like comprise an antenna circuit board where an antenna is formed on a substrate and an interposer board where an enlarged metal electrode is formed and connected to the electrode of the IC chip mounted on a substrate, and are configured such that the metal electrode of the antenna and the enlarged metal electrode are joined with a conductive adhesive material and the two boards (i.e., the antenna circuit board and the interposer board) are laminated and joined (i.e., international publication pamphlet No. 01/62517 (FIG. 1, FIG. 10).)

However, the conductive adhesive material used for well-known art is either paste adhesive or film-type adhesive with adhesion or joining properties where the conductive particles are dispersed within a resin. Accordingly, upon the laminating and joining of the two boards, conductive adhesive material is applied or stuck to one of the electrodes, and following this, laminating and joining is carried out while aligning the position thereof with that of the other electrode; subsequently, the two electrodes are indirectly connected through the pressurizing and heating of heat sealing (i.e., the conductive adhesive material is interposed between the two metal electrodes while both boards are joined to be integrated; furthermore, the same applies hereinafter).

However, when a conductive adhesive material of the paste type described above is used, a problem has existed in that, after performing a prescribed drying or semi-curing treatment on the paste-type conductive adhesive material coated onto the electrode, it was necessary to laminate both boards aligning the position thereof with that of the other electrode.

Alternatively, when a conductive adhesive material of the film type described above is used, since laminating is carried out on a protecting film already in a dried condition or a semi-cured condition, even though both boards can be laminated after application of the film-type conductive adhesive material on an electrode in such a manner that the position thereof is immediately aligned with that of the other electrode, there has been a problem that the protecting film has to be peeled off from the conductive adhesive material applied to the electrode immediately after the application.

Accordingly, in the former method, an applying process and drying or semi-curing process of the conductive adhesive material have been required, and in the latter method, a pasting process and a peeling process of the conductive adhesive material has been required. Therefore these processes caused an increase in equipment costs and a drop in productivity preventing the manufacturing cost of non-contact ID cards and the like from being reduced.

In another example that the above-described conductive adhesive material is not used, furthermore, it is normal practice that, by joining together of the substrate of the antenna board and the substrate of the interposer board, both substrates are laminated in such a manner that the antenna's metal electrode and enlarged metal electrode are made to make close mutual contact. In this case, however, since the two electrodes are simply in a state of contact and are not in a jointed body, comparing with the bonding of the above-mentioned "indirectly connected" state that a joined body is achieved using conductive adhesive material, electrical properties are not constant and even vary widely; therefore, it has not been in a practical use.

Furthermore, the use of resin electrodes in place of the above-described antenna's metal electrode or enlarged metal electrode is already known in the prior art (above mentioned international publication pamphlet No. 01/62517, page 10, line 25 through page 11, line 4 and page 11, lines 19 through 21). The resin electrode is formed by coating or applying a conductive resin paste comprising conductive particles dispersed within a liquid thermosetting resin onto a substrate, and although in cases where this type of resin paste electrode (i.e., an electrode made of a resin paste before cured; furthermore, the same applies hereinafter) is formed, direct joining of both electrodes by pressurizing and heating (i.e., joining wherein both electrodes are joined to be integrated without interposing a resin adhesive material there between; furthermore, the same applies hereinafter) is possible, a relatively long period of time is required for curing, leading to a marked drop in ease of manufacture and making use thereof in actual manufacturing undesirable.

SUMMARY OF THE INVENTION

The present invention takes various above-described problems in the prior art into consideration. In the field of non-contact ID cards and the like comprising an antenna circuit board where antenna is formed on a substrate and an interposer board where an enlarged electrode is formed to be connected to the electrode of the IC chip mounted on a substrate, both boards being laminated with the electrode of the antenna and the enlarged electrode in such a manner to come direct contact with each other, the present invention aims to provide a low-cost non-contact ID card having practical electrical characteristics and to provide a suitable manufacturing method for achieving such a non-contact ID card and the like.

In order to achieve the above-described goal, the present invention has the following configurations (1) through (7).

(1) A non-contact ID card or the like, comprising an antenna circuit board where an antenna is formed on a substrate and an interposer board where an enlarged electrode to be connected to an electrode of an IC chip is formed on a substrate mounted with the IC chip, and laminating said antenna circuit board and said interposer board in such a manner that the electrode of the antenna comes in direct contact with the enlarged electrode;

characterized in that the enlarged electrode is a resin electrode made of a conductive resin containing thermoplastic resin.

(2) The non-contact ID card or the like of item (1) above, further characterized in that a portion of the molecular chain of the thermoplastic resin is modified with a reactive group.

(3) The non-contact ID card or the like of item (1) or (2) above, further characterized in that the IC chip is embedded in and mounted on the substrate.

(4) A method of manufacturing a non-contact ID card or the like, comprising an antenna circuit board where an antenna is formed on a substrate and an interposer board where an enlarged electrode to be connected to an electrode of an IC chip is formed on a substrate mounted with the IC chip, and joining the electrode of the antenna and the enlarged electrode to come in direct contact with each other by pressurizing and heating, after laminating said antenna circuit board and said interposer board in such a manner that the positions of the antenna electrode and the enlarged electrode are aligned;

characterized in that the enlarged electrode is provided as a resin electrode which is formed through the application of a conductive resin paste containing a thermoplastic resin on the substrate.

(5) The method of manufacturing a non-contact ID card or the like of item (4) above, further characterized in that a portion of the molecular chain of the thermoplastic resin modified with a reactive group is used as the thermoplastic resin.

(6) The method of manufacturing a non-contact ID card or the like of item (5) above, further characterized in that the IC chip is embedded in and mounted on the substrate.

(7) The method of manufacturing a non-contact ID card or the like of item (4), (5) or (6) above, further characterized in that the application of the conductive resin paste is carried out by a screen printing method.

In accordance with the above-described non-contact ID card and the like of the present invention, in non-contact ID cards and the like, comprising an antenna circuit board where an antenna is formed on a substrate and an interposer board where an enlarged electrode is formed to be connected to the electrode of the IC chip mounted on a substrate, laminating both boards in such a manner that the electrode of the antenna comes in contact with the enlarged electrode each other thereof, the enlarged electrode is provided as a resin electrode formed of conductive resin containing thermoplastic resin; accordingly, both electrodes can be made to make direct contact, and as a result, it is possible to eliminate applying, drying, and/or semi-curing processes of the conductive adhesive material.

Furthermore, in accordance with the manufacturing method of the non-contact ID cards and the like of the present invention as described above, upon the manufacture of non-contact ID cards and the like, comprising an antenna circuit board where an antenna is formed on a substrate and an interposer board where an enlarged electrode is formed to be connected to the electrode of the IC chip mounted on a substrate, laminating the antenna board and the interposing board in such a manner that the electrode of the antenna comes contact with the enlarged electrode each other, since a resin electrode formed by application of a conductive resin paste containing thermoplastic resin on a substrate where the IC chip is mounted is provided as the enlarged electrode, both electrodes can be made to make direct contact, accordingly, in addition to the ability to eliminate both the applying process of the conductive adhesive material and the film peeling process, electrical properties of the non-contact ID card and the like thus obtained is kept stable, thereby, it is possible to reduce facility costs and to improve productivity, therefore a method to obtain a low-cost non-contact ID card and the like with a sufficient joining strength and excellent electrical properties can be realized.

DETAILED DESCRIPTION OF THE PREFERRED EMBODIMENTS

Figure 1:
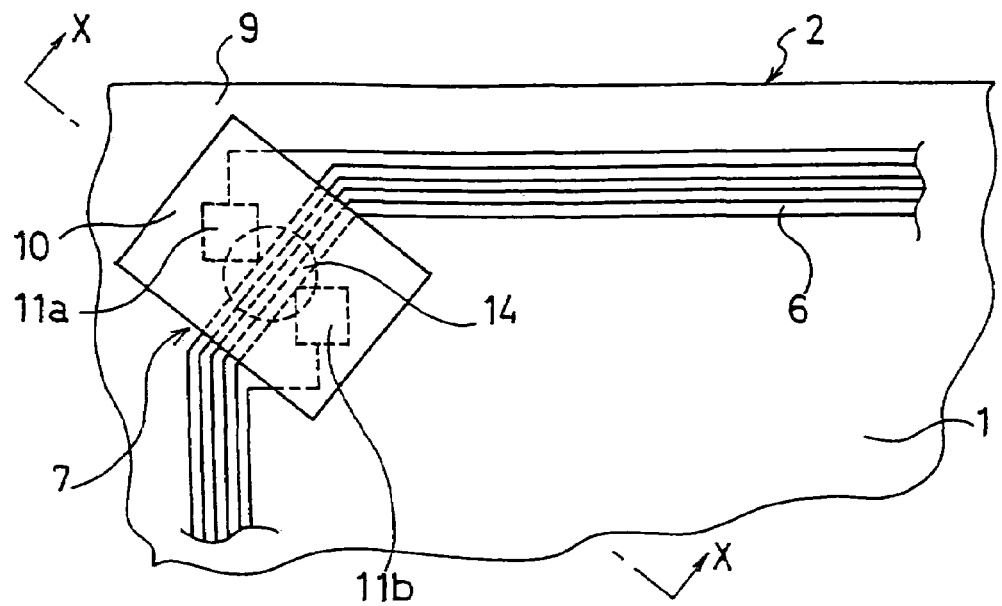
FIG. 1 is a schematic plane view describing a non-contact ID card and the like according to the present invention.
Figure 2:
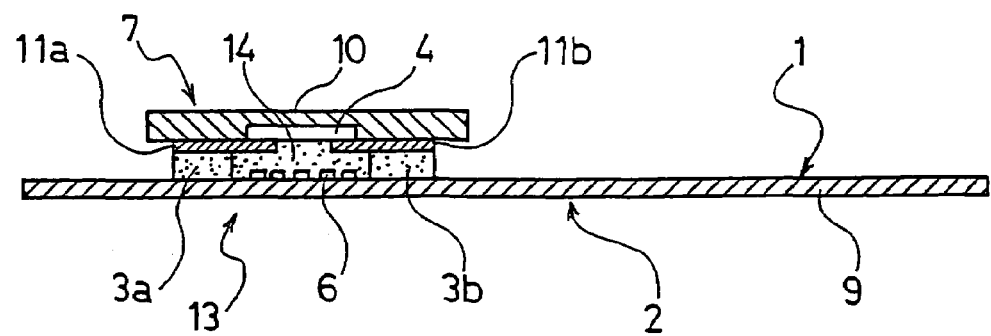
FIG. 2 is a schematic sectional view corresponding to X-X cross-section of FIG. 1 describing the construction of the non-contact ID card and the like according to the present invention.

The non-contact ID card and the like according to the present invention comprises a laminated configuration of an antenna circuit board and an interposer board, and the configuration thereof is illustrated in FIG. 1 and FIG. 2.

That is to say, FIG. 1 is a schematic plane view describing the non-contact ID card and the like according to the present invention, and FIG. 2 is a schematic sectional view corresponding to X-X of FIG. 1.

As shown in FIG. 1 and FIG. 2, in the non-contact ID card and the like according to the present invention, the metal electrodes 3a, 3b of the antenna circuit board 2 disposed on the lowerside thereof (hereinafter, the "antenna metal electrodes") and the enlarged resin electrodes 11a, 11b of the interposer board 7 disposed on the upperside thereof are directly joined; in other words, the antenna metal electrodes 3a, 3b and the enlarged resin electrodes 11a, 11b are in mutual surface contact and both electrodes are joined to be integrated.

The above-described antenna circuit board 2 is configured so as to have an antenna 6 and the antenna metal electrodes 3a, 3b connected thereto disposed on thermoplastic resin film comprising the substrate 9.

Figure 3:
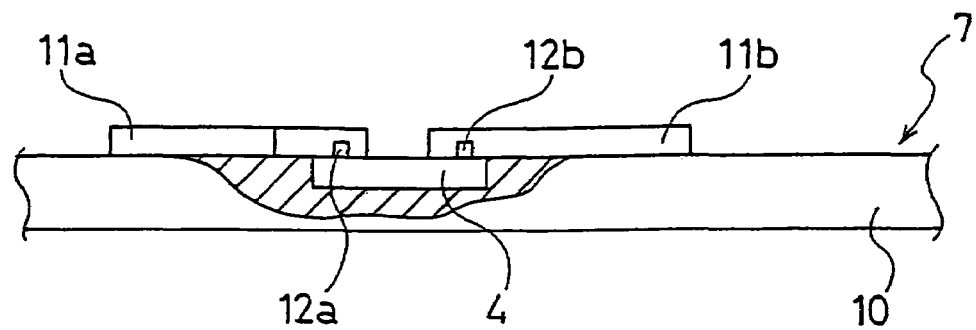
FIG. 3 is a cutaway view describing the construction of an interposer board capable of being used in a non-contact ID card and the like according to the present invention.

Furthermore, the interposer board 7 is formed by attaching the IC chip 4 onto the thermoplastic resin film comprising the substrate 10, and preferably the chip is embedded in. More specifically, it is preferable as shown in FIG. 3 that the IC chip 4 is embedded in such a manner that the surface of the IC chip and the upper surface of the substrate 10 form a substantially same plane.

Figure 4:
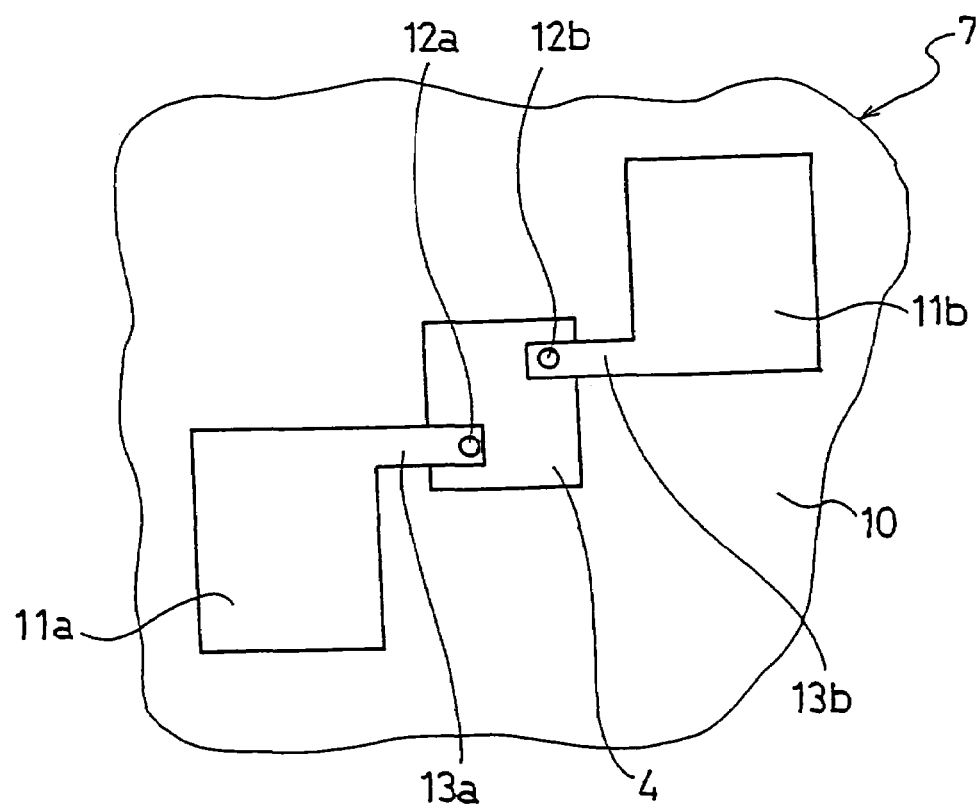
FIG. 4 is a schematic view corresponding to a general plan view of FIG. 3 describing the construction of an interposer board capable of being used in the non-contact ID card and the like according to the present invention.

Furthermore, the enlarged resin electrodes 11a, 11b are disposed so as to straddle the upper surface of the substrate 10 and the circuit face of the IC chip 4 as shown in the accompanying drawings. Furthermore, as shown in the plane view of FIG. 4, the metal electrodes 12a, 12b of the IC chip 4 are connected to the thin leads 13a, 13b for the enlarged resin electrodes 11a, 11b. The metal electrodes 12a, 12b of the IC chip 4 are, for example, aluminum electrodes. Similarly, the antenna metal electrodes 3a, 3b are, for example, aluminum electrodes.

In contrast, the enlarged resin electrodes 11a, 11b are formed of a conductive resin containing thermoplastic resin, thus realizing the most important characteristic of the present invention. The expression "formed of a conductive resin containing thermoplastic resin" can, for example, refer to the process of forming by coating or printing using a conductive resin paste containing thermoplastic resin on the substrate 10 and by diffusing the solvent portion thereof to dry or semi-cure the paste. It is not necessary for the entirety of the enlarged resin electrode to be formed of a conductive resin containing thermoplastic resin, and it is acceptable for a portion of the surface thereof at least to be formed of a conductive resin containing thermoplastic resin.

That is to say, the term "the enlarged electrode is provided as a resin electrode formed of conductive resin containing thermoplastic resin" from (1) above indicates that at least the surface of an enlarged electrode to be provided is formed of conductive resin containing thermoplastic resin. Accordingly, it is acceptable if conductive resin containing thermoplastic resin is contained as a film, for example, in the surface of the enlarged electrode, and it is not necessary for the matrix to be formed of conductive resin containing thermoplastic resin.

As described above, it is preferable for the IC chip 4 to be embedded in the substrate 10, and for the enlarged resin electrodes 11a, 11b to be simply formed by a printing method such as screen printing such as to connect with the metal electrodes 12a, 12b of the IC chip 4.

The above-described conductive resin paste containing thermoplastic resin can be, for example, a paste in which conductive particles are dispersed in thermoplastic resin having been dissolved in solvent, or a paste wherein conductive particles are dispersed in the mixture formed when thermosetting resin and thermoplastic resin are dissolved in solvent together.

As the thermoplastic resin in question softens or solidifies in reaction to heating or cooling in a short period of time, it is possible to join electrodes by pressurizing and heating in a very short space of time.

The non-contact ID card and the like according to the present invention can be manufactured by lamination of the antenna circuit board 2 and interposer board 7 in such a manner that the positions of the antenna metal electrodes 3a, 3b and the enlarged resin electrodes 11a, 11b are aligned, and then, by direct joining of both electrodes by pressurizing and heating.

At this time, for example, the thermoplastic resin forming the enlarged resin electrodes 11a, 11b is softened or fusion-bonded to the antenna metal electrodes 3a, 3b if pressurizing and heating of the antenna circuit board 2 disposed on the lowerside by lowering a heat tool from the top thereof is carried out; accordingly, both electrodes can be directly joined quickly and in a favorable condition. As a result of this direct joining, the antenna metal electrodes 3a, 3b and the enlarged resin electrodes 11a, 11b are securely joined in a mutual surface contact state to be integrated; accordingly, the electrical properties thereof are consistent and practical usage thereof is possible.

In the present invention, only in cases where the enlarged electrode is provided as a resin electrode formed of conductive resin containing thermoplastic resin, it is acceptable for the antenna electrode to be provided as a metal electrode or a resin electrode.

More specifically, it is acceptable for an antenna resin electrode to be provided instead of the antenna metal electrodes 3a, 3b; accordingly, it is possible to achieve the same result as that of the above-described example wherein the antenna metal electrodes 3a, 3b and the enlarged resin electrodes 11a, 11b are provided.

The reason for providing an enlarged electrode as a resin electrode formed of a conductive resin containing thermoplastic resin instead of an antenna electrode in the present invention is that enlarged electrodes are in general larger than antenna electrodes; accordingly, the enlarged electrodes are preferable in that the required volume of conductive resin paste (i.e., the volume required to attain joining strength of a practical-usage level) can be favorably applied or printed thereon.

In cases where antenna metal electrodes 3a, 3b and enlarged resin paste electrodes are provided, it is acceptable that the antenna metal electrodes 3a, 3b are directly joined with enlarged resin paste electrodes by pressurizing and heating, after laminating the antenna circuit board 2 and interposer board 7 in such a manner that positions thereof are aligned. The same applies in situations where antenna resin electrodes and enlarged resin paste electrodes are provided. When using a thermoplastic resin modified with a reactive group, the addition of a heating curing process by introduction into a curing oven after pressurizing and heating can increase the strength of joining.

In terms of the above-described conductive resin paste, it is acceptable to configure such that only thermoplastic resin is used, alternatively, it is also acceptable to use a mixture of thermoplastic resin and thermosetting resin.

A specific example of using only thermoplastic resin is realized by dissolving only thermoplastic resin (for example, polyester resin etc.) in a solvent such as ethanol, xylene, or toluene, etc., and by dispersing conductive particles (i.e., silver particles) therein such that a mixture of silver powder not less than 80% wt. and thermoplastic resin not more than 20% wt. is dissolved in the solvent. By using this hot-melt based conductive resin, the time required for joining by pressurized heating can be reduced.

Specific examples, furthermore, of cases wherein a mixture of thermoplastic resin and thermosetting resin is used can be realized by dissolving a thermoplastic resin (for example, polyester resin etc.) in a solvent while also dissolving a thermosetting resin (for example, epoxy based resin etc.) therein and by dispersing silver particles etc. in the mixture thereof, or alternatively, by modifying a portion of the molecular chain of a thermoplastic resin with a high molecular weight (for example, polyester resin etc.) using the reactive group of epoxy resin etc with thermosetting properties, by dissolving the corresponding resin in solvent, and by dispersing conductive particles such as silver powder therein.

A conductive bond with sufficient reliability can be achieved in this type of conductive resin by performing a normal thermosetting process after pressurizing and heating of the electrode joint part using a heat tool and temporarily joining (i.e., temporary bonding) in a conductive condition.

In terms of other specific examples, adhesives that cross-link a thermoplastic resin of high molecular weight and modified with epoxy resin using a setting agent of low molecular weight are conceivable; however, these posses hot-melt properties and are one-component type of thermosetting resin with excellent storage stability. A balance can be achieved between peeling strength and shearing strength by forming a nondense cross-linking structure, and excellent durability is also demonstrated thereby.

It is preferable that the mixture ratio of thermoplastic resin in the above-described mixture of thermoplastic resin and thermosetting resin be between 25% and 95% wt. with respect to the combination of both resins, and more preferable that this be between 75% and 95%.

Accordingly, of thermoplastic properties and thermosetting properties, the former in prominent in the conductive resin paste obtained by dissolving this type of mixture in a solvent, and the thermosetting properties thereof represent an auxiliary characteristic.

In addition to the above-described polyester resin, polyurethane resin, phenoxy resin, acrylic resin, vinyl chloride-vinyl acetate resin, polybutadiene, etc. are identified as suitable thermoplastic resins. In addition, hydroxyl group, amino group, carboxyl group, phenol group, isocynate group, block isocynate group, glycidyl group, and (meta) acryloyl group can be used as the reactive group modifying a portion of the molecular chain of thermoplastic resin; however, of these, hydroxyl group, amino group, carboxyl group, isocynate group, block isocynate group and glycidyl group are preferable.

Furthermore, in terms of conductive particles, silver particles, copper particles, gold particles, platinum particles and other noble metal particles; nickel particles, aluminum particles and carbon particles; or particles of copper or nickel and plated with noble metal as silver etc. can be identified. It is acceptable for one type of these conductive particles or a mixture of two or more types thereof to be used. In terms of reliability, silver particles or particles of copper or nickel plated with a noble metal such as silver are preferable. It is acceptable for the particles to be particulate, scaly, plate-like, dendritic, or of any other shape; however, scale shaped particles are preferable. The preferred range of particle diameter is 0.1 μm to 100 μm, and the range of 0.1 μm to 20 μm is more preferable.

In terms of solvents, butyl acetate and isobutyl acetate, etc. can be identified as suitable ester type solvents; methyl isobutyl ketone, cyclohexanone and diacetone alcohol, etc. can be identified as suitable ketone type solvents; ethyl cellosolve, butyl cellosolve, ethylcellosolve acetate, butyl cellosolve acetate, ethyl carbitol, and butyl carbitol, etc. can be identified as suitable ether/ester type solvents; and toluene, xylene, or mixtures of any type of aromatic hydrocarbon compound can be identified as suitable hydrocarbon type solvents. It is acceptable for one type of these solvents or a mixture of two or more types thereof to be used.

In the substrate 9 of the antenna circuit board 2 thereof, it is acceptable for resin film, paper, or non-woven fabric to be present as an insulating simplex material, and similarly, in the substrate 10 of the interposer board 7 thereof, it is acceptable for resin film or a laminar material containing resin film (for example, laminated resin film and paper, etc.) to be present as an insulating simplex material. It is preferable that a resin film with thermoplastic properties be selected.

Furthermore, mounting of the IC chip 4 on the substrate 10 of the interposer board 7 thereof is not restricted to the above-described embedding format, and general configurations in which the chip is not embedded are acceptable; however, in terms of thinning, it is preferable that the substrate 10 be comprised of resin film—and more preferably, of thermoplastic resin film—and for the IC chip 4 to be embedded therein.

In cases wherein, as described above, only the enlarged electrode or both the antenna's electrode and the enlarged electrode comprise resin electrodes formed of a conductive resin containing thermoplastic resin, it is preferable that the electrodes are formed by screen printing. However, this is not restrictive and other formation methods are also acceptable.

In terms of conditions for joining of both electrodes, in cases when only the enlarged electrode is formed of conductive resin paste containing only polyester thermoplastic resin, it is preferable that the pressurization force be between 10 g and 20 kg per 2.5 mm×2.5 mm area, and more preferable that this be between 50 g and 5 kg per same area. In specific terms, when the heat tool temperature is 120° C., joining of both electrodes can be carried out with pressurization duration of between 0.5 and 5 seconds. In terms of junction resistance of both electrodes at this time, the pass conditions of both a high-temperature and high-humidity test at 60° C. and a relative humidity of 93% and of a cold-heat cycle test between −40° C. and 80° C. were satisfied.

In addition to the above-described aluminum electrodes, it is acceptable for the electrodes 12a, 12b of the IC chip 4 to be, for example, copper electrodes or aluminum electrodes applied oxidation inhibition treatment on the surface (i.e., treatment forming a gold plated layer on a plating layer of nickel, titanium, molybdenum, etc.), and furthermore, it is preferable, in order to achieve adequate connection with the enlarged resin electrode, for an under barrier metal layer (UBM layer) to be formed. In the same way as the above-described electrodes 12a, 12b of the IC chip 4, and in addition to aluminum electrodes, it is acceptable also for the antenna metal electrode to be a copper electrode or aluminum electrode with surfaces treated by oxidation inhibition (i.e., treatment forming a gold plated layer on a plating layer of nickel, titanium, molybdenum, etc.).

Furthermore, instead of forming the substrate 10 of the interposer board 7 of a thermoplastic resin film, it is acceptable for the substrate 9 of the antenna circuit board 2 to be formed of a thermoplastic resin film. In other words, a configuration that features either one or both of the substrates of the interposer board 7 or the antenna circuit board 2 as a thermoplastic resin film is acceptable.

In addition to polyethylene terephthalate glycol (PET-G), it is acceptable for the above-described thermoplastic resin film to comprise polyethylene terephthalate (PET), polysulfone (PSF), polyethersulfone (PES), liquid crystal polymer (LCP) or polyether ethyl ketone (PEEK), etc.

Figure 5:
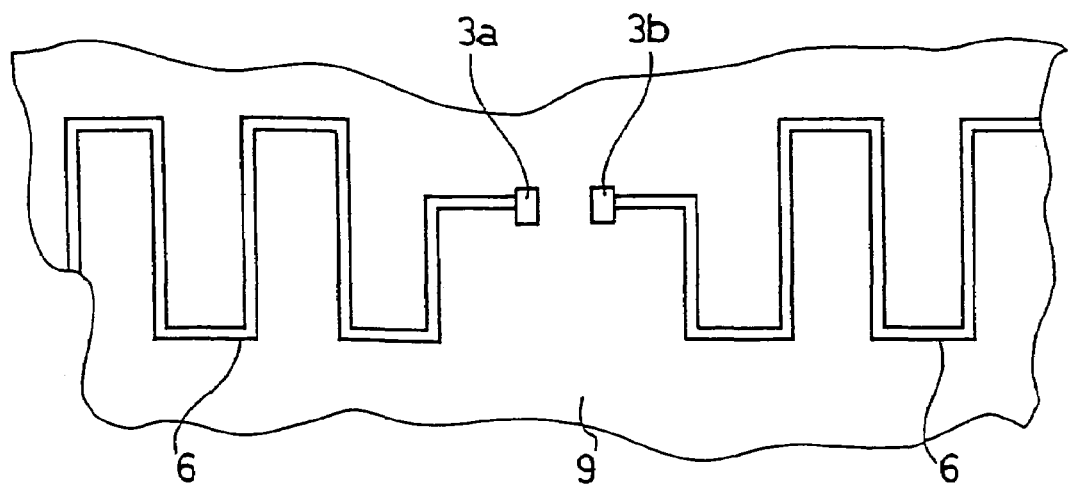
FIG. 5 is a schematic plane view illustrating a comb tooth type antenna capable of being used in the non-contact ID card and the like according to the present invention.

It is acceptable for the antenna 6 of the antenna circuit board 2 to be of a spiral shape, a comb-tooth shape (FIG. 5), or any other shape, and also for insulation material 14 to be charged into the gap 13 at the electrode joint part.

Figure 6:
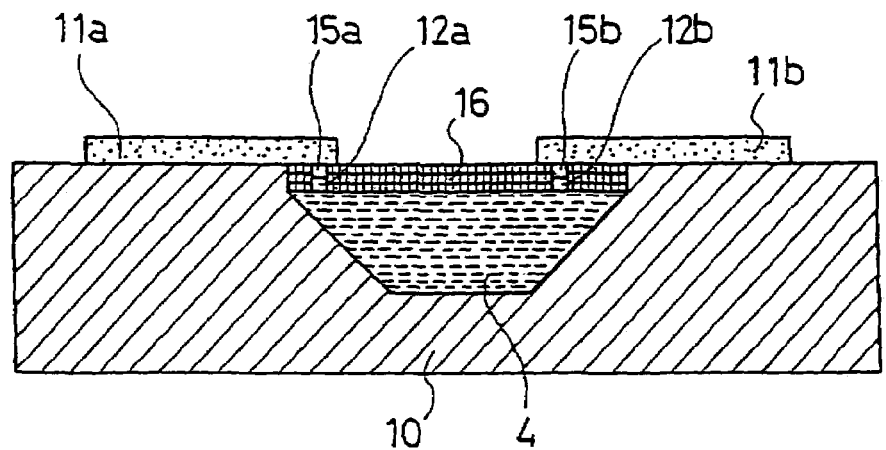
FIG. 6 is a longitudinal section view illustrating another interposer board capable of being used in the non-contact ID card and the like according to the present invention.
Figure 7:
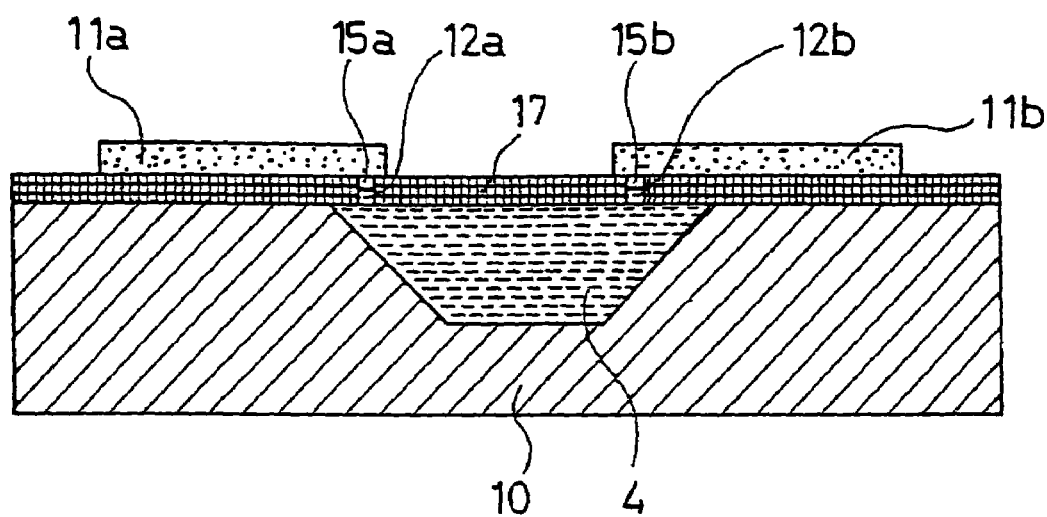
FIG. 7 is a longitudinal section view illustrating another interposer board capable of being used in the non-contact ID card and the like according to the present invention.

Embedding of the IC chip 4 is not restricted to the above description, and embedding as shown in FIG. 6 and FIG. 7 is also acceptable. Although no insulation layer is formed in the embedding condition of FIG. 1, insulation layers 16, 17 are formed in the embedding condition of FIG. 6 and FIG. 7 respectively.

The IC chip 4 forming the insulation layer 16 shown in the drawings is prepared in advance, inserted into a tapered recess formed in the interposer substrate 10, and fixed using adhesive. Any method of forming the tapered recess may be used, such as formation by application of a heated punch to the interposer substrate 10.

As shown in the drawings, the insulation layer 16 is formed to a specific pattern such that the electrodes 12a, 12b are exposed thereto. After applying of photo-resist onto the electrodes 12a, 12b in order that they be coated and dried thereof, this is formed using photo-master by exposing and developing only the sections corresponding to the electrodes 12a, 12b. Accordingly, in addition to the ability to form the laminated conductors 15a, 15b by charging a conductive resin paste with thermosetting or thermoplastic properties onto the electrodes 12a, 12b, it is subsequently possible to form the enlarged resin electrodes 11a, 11b in such a manner that contact is made with the laminated conductors 15a, 15b.

Meanwhile, after inserting the IC chip 4 into the tapered recess in the interposer substrate 10 and fixing thereof using adhesive, the insulating layer 17 of FIG. 7 can be formed on the flat surface comprising the IC chip 4 and the substrate 10 (i.e., on the upper surface flattened in order that no steps are formed). In this way, the enlarged resin electrodes 11a, 11b and the substrate 10 are insulated across the entire surfaces thereof by the insulating layer 10. Accordingly, in contrast to the embedding method shown in FIG. 6, the method of FIG. 7 is superior in terms of insulation.

INDUSTRIAL APPLICABILITY

As described above, in the production of a non-contact ID card or the like, comprising an antenna circuit board where an antenna is formed on the substrate and an interposer board where an enlarged metal electrode is formed to be connected to the electrode of the IC chip on the substrate on which the IC chip is mounted, laminating both boards in such a manner that the electrode of the antenna comes in direct contact with the enlarged electrode, the present invention facilitates simple and accurate alignment of the position of the enlarged electrode with respect to the antenna electrode of the antenna circuit board; accordingly, it is possible to prevent any increases in the cost of production of non-contact IC cards (in particular, mounting costs), even upon miniaturization thereof. Consequently, the present invention can be used to advantage in the production of non-contact ID cards.

DESCRIPTION OF SYMBOLS

1: Non-contact ID card and the like according to the present invention
2: Antenna circuit board
3a, 3b: Antenna metal electrodes
4: IC chip
6: Antenna
7: Interposer board
9: Substrate of antenna circuit board (i.e., resin film)
10: Substrate of interposer board (i.e., thermoplastic resin film)
11a, 11b: Enlarged resin electrodes
12a, 12b: Metal electrodes
13a, 13b: Thin leads for enlarged resin electrodes 11a, 11b
15a, 15b: Laminated conductor
16: Insulating layer
17: Insulating layer

What is claimed is:

1. A non-contact ID card or the like, comprising an antenna circuit board where an antenna is formed on a substrate and an interposer board where an enlarged electrode to be connected to an electrode of an IC chip is formed on a substrate mounted with the IC chip, and laminating said antenna circuit board and said interposer board in such a manner that the electrode of the antenna comes in direct contact with the enlarged electrode;
    characterized in that the enlarged electrode is a resin electrode made of a conductive resin containing thermoplastic resin.

2. The non-contact ID card or the like of claim 1, further characterized in that a portion of the molecular chain of the thermoplastic resin is modified with a reactive group.

3. The non-contact ID card or the like of claim 1 or 2, further characterized in that the IC chip is embedded in the substrate.

4. A method of manufacturing a non-contact ID card or the like, comprising an antenna circuit board where an antenna is formed on a substrate and an interposer board where an enlarged electrode to be connected to an electrode of an IC chip is formed on a substrate mounted with the IC chip, and joining the electrode of the antenna and the enlarged electrode to come in direct contact with each other by pressurizing and heating, after laminating said antenna circuit board and said interposer board in such a manner that the positions of the antenna electrode and the enlarged electrode are aligned;
    characterized in that the enlarged electrode is provided as a resin electrode which is formed through the application of a conductive resin paste containing a thermoplastic resin on the substrate.

5. The method of manufacturing a non-contact ID card or the like of claim 4, further characterized in that a portion of the molecular chain of the thermoplastic resin modified with a reactive group is used as the thermoplastic resin.

6. The method of manufacturing a non-contact ID card or the like of claim 5, further characterized in that the IC chip is embedded in and mounted on the substrate.

7. The method of manufacturing a non-contact ID card or the like of claim 4, 5 or 6, further characterized in that the application of the conductive resin paste is carried out by a screen printing method.

* * * * *